(12) United States Patent
Lipson et al.

(10) Patent No.: US 7,081,278 B2
(45) Date of Patent: Jul. 25, 2006

(54) METHOD FOR PROTECTION OF ADHESIVES USED TO SECURE OPTICS FROM ULTRA-VIOLET LIGHT

(75) Inventors: Matthew Lipson, Stamford, CT (US); Ronald A Wilklow, Fairfield, CT (US)

(73) Assignee: ASML Holdings N.V., Veldhoven (NL)

( * ) Notice: Subject to any disclaimer, the term of this patent is extended or adjusted under 35 U.S.C. 154(b) by 231 days.

(21) Appl. No.: 10/253,655

(22) Filed: Sep. 25, 2002

(65) Prior Publication Data

US 2004/0058061 A1 Mar. 25, 2004

(51) Int. Cl.
*B05D 3/06* (2006.01)
*B05D 5/06* (2006.01)
*G02B 7/00* (2006.01)

(52) U.S. Cl. .............. 427/553; 427/508; 427/512; 427/160; 427/207.1; 427/284; 427/164; 359/819; 156/60

(58) Field of Classification Search .............. 427/553, 427/558, 559, 595, 160, 162, 164, 165, 240, 427/425, 284, 429, 508, 512, 207.1; 359/350, 359/355, 361, 819; 156/60; 250/503.1, 250/504 R; 378/34
See application file for complete search history.

(56) References Cited

U.S. PATENT DOCUMENTS

| | | | | |
|---|---|---|---|---|
| 1,507,327 A | * | 9/1924 | Wrighton | ..................... 427/164 |
| 3,851,621 A | * | 12/1974 | Shepard | ..................... 118/102 |
| 3,953,115 A | * | 4/1976 | French et al. | ................ 351/166 |
| 4,222,747 A | * | 9/1980 | Dauguet et al. | .............. 51/301 |
| 4,643,911 A | * | 2/1987 | Inoue et al. | ................. 427/510 |
| 4,824,712 A | * | 4/1989 | Falleroni et al. | ............ 428/137 |
| 4,842,941 A | * | 6/1989 | Devins et al. | .............. 428/412 |
| 4,904,525 A | * | 2/1990 | Taniguchi et al. | .......... 428/328 |

(Continued)

FOREIGN PATENT DOCUMENTS

DE  1 011 589  7/1959

(Continued)

OTHER PUBLICATIONS

Search Report from European Patent Application Number 03021738.4, 3 pages (dated Feb. 26, 2004).

(Continued)

*Primary Examiner*—Timothy Meeks
*Assistant Examiner*—Wesley D. Markham
(74) *Attorney, Agent, or Firm*—Sterne, Kessler, Goldstein & Fox PLLC

(57) ABSTRACT

A method for reducing the scattered light emitted through an optical element is provided that protects adhesive used to hold the optical element in place from light induced deterioration. In one embodiment, the method includes applying a thin coating of an organoxy metallic compound to a region on an optical element where adhesive will be applied and exposing the organoxy metallic compound to ultra-violet light. Exposure to ultra-violet light converts the organoxy metallic compound to its corresponding metal oxide forming an optically inert, light absorbing coating that protects adhesive used to hold the optical element in place from light induced deterioration.

4 Claims, 4 Drawing Sheets

U.S. PATENT DOCUMENTS

| | | | |
|---|---|---|---|
| 4,976,998 A * | 12/1990 | Morimitu et al. | 427/284 |
| 5,449,534 A * | 9/1995 | Oishi et al. | 427/512 |
| 6,017,609 A * | 1/2000 | Akamatsu et al. | 428/141 |
| 6,097,536 A | 8/2000 | Bauer et al. | |
| 6,180,188 B1 * | 1/2001 | Belleville et al. | 427/515 |
| 6,309,755 B1 * | 10/2001 | Matsco et al. | 428/451 |
| 6,352,747 B1 * | 3/2002 | Blackburn et al. | 427/425 |
| 6,574,039 B1 * | 6/2003 | Murata et al. | 359/359 |
| 6,655,946 B1 * | 12/2003 | Foreman et al. | 425/145 |

FOREIGN PATENT DOCUMENTS

| | | |
|---|---|---|
| EP | 1 277 571 A1 | 1/2003 |
| JP | 06-087151 A * | 3/1994 |
| WO | WO 01/31401 A1 | 5/2001 |

OTHER PUBLICATIONS

English-Abstract for Japanese Patent Publication No. 11-256342, published Sep. 21, 1999, 1 page, printed from http://v3.espace.com.

English-Abstract for Japanese Patent Publication No. 4-295810, published Oct. 20, 1992, 1 page, printed from http://v3.espace.com.

Search Report from Singapore Patent Application No. 200305614-0, filed Sep. 23, 2003, 6 pages.

* cited by examiner

METHOD FOR PROTECTION OF ADHESIVES USED TO SECURE OPTICS FROM ULTRA-VIOLET LIGHT

BACKGROUND OF THE INVENTION

1. Field of the Invention

The present invention relates to securing optical elements, more particularly, to applying an optically inert, light absorbing coating on an optical element for the protection of adhesives used to secure optics from ultra-violet light.

2. Related Art

The secure positioning of optical elements within an optical system is crucial, particularly in very high precision optical systems, such as those used in photolithography. Optical system developers use several approaches to securely position optical elements within a system, including clamping an optical element in place, encasing an optical element entirely within an enclosure, and using an adhesive to hold an optical element in place. The current invention relates to approaches using an adhesive to hold an optical element in place. The term adhesive as used herein refers to any chemical compound used to secure an optical element, including but not limited to glues, epoxies, and cements.

The use of an adhesive to hold an optical element in place provides a cost-effective means to securely position an optical element. Additionally, the use of adhesives to secure an optical element in place imparts less mechanical stress on the optical element than a purely mechanical mount. Typically, an adhesive is applied to an optical element and the optical element positioned within a mount or other fixture. The adhesive may be applied to either an edge or a portion of the polished surface of an optical element depending on the desired orientation of the optical element. The optical element is held in place while the adhesive is permitted to dry. Upon drying, the adhesive between the optical element and the mount provides a solid bond that holds the optical element securely in place.

Unfortunately, scattered light from light passing through an optical element may photochemically degrade the adhesive and cause the bond to weaken over time. Within optical elements that allow light to pass through their polished surfaces, a portion of the scattered light is internally reflected and propagates to points where an adhesive bonds with the optical element. In the case where an adhesive is used to hold the optical element in place, the scattered light impinges on the adhesive. The light impinging on the adhesive causes the adhesive to break down, and the bond between the optical element and the mount begins to weaken. As the integrity of the bond weakens, the optical element may move or even become dislodged. Neither situation is acceptable, particularly in very high precision optical systems.

In addition, many adhesives undergo out-gassing when they are impinged upon by ultra-violet light. These out-gasses may have the deleterious impact of creating a thin residue on the polished optical surfaces that impairs the functioning of the optical system.

Placing a light absorbing coating on points of an optical element where adhesive will be applied prior to affixing it with an adhesive addresses the above problems by reducing the amount of light that impinges upon the adhesive. There are numerous methods, such as chemical vapor deposition and ion beam sputter for applying a coating to an optical element. Systems using these approaches principally are designed to very precisely coat the polished optical surfaces. As a result, they are very expensive, require extensive set-up time, and are particularly poorly suited for applying a coating to an edge of an optical element.

SUMMARY OF THE INVENTION

The present invention is directed to a method for reducing the amount of scattered light emitted through an optical element to protect an adhesive used to hold the optical element in place from light induced deterioration. The method includes applying a thin coating of an organoxy-metallic compound to points on an optical element where adhesive will be applied and curing the organoxy-metallic compound to leave behind an optically inert, light absorbing metal oxide film on the points on the optical element where adhesive will be applied.

In one embodiment of the invention, an optical applicator cloth is used to apply a coating of organoxy-metallic compound to the points on an optical element where adhesive will be applied. The coating is then exposed to ultra-violet light that converts the organic substituents of the organoxy-metallic compound to volatile molecules that evaporate off leaving behind a metal oxide film. Upon the completion of this process, an optical element is produced that has a thin, light absorbing, metal oxide coating on points where adhesive will be applied. The optical element may then be secured into position by placing adhesive between the light absorbing coating and a mount or fixture where the optical element is to be located.

Treatment of an optical element using the current invention provides two principal benefits. First, applying the light absorbing coating to an optical element using the current invention reduces the light-induced deterioration of an adhesive used to hold an optical element in place. Ordinarily, ultra-violet light will be internally scattered and propagated to points on an optical element where adhesive has been applied. The light emitted will impinge upon the adhesive resulting in deterioration of the adhesive. The adhesive deterioration will enable potential movement of the optical element leading to reduced performance or even failure of the optical system. The present invention will prevent the adhesive deterioration and resulting undesirable affects.

Second, the present invention leads to a reduction in out-gassing as compared to conventional mounting techniques using an adhesive. When ultra-violet light impinges upon an adhesive, the adhesive will emit gasses that may produce a thin film residue on the polished surfaces of an optical element leading to reduced performance of the optical system. Once again, the present invention will reduce out-gassing from the adhesive and the resulting undesirable affects.

There are several advantages of the present invention over other methods that might be adapted to apply a light absorbing coating to prevent light from impinging on adhesives used to secure an optical element. There are numerous types of systems to apply thin coatings to polished surfaces of optical elements. These systems are very expensive, require extensive set-up time, and, in particular, do not provide a cost-effective way to coat the edge of an optical element. Their design limits their ability to apply a thin coating to the edge of an optical element. Retrofitting or adapting these systems to apply a coating to an edge is time-consuming and costly, and often, cost prohibitive.

Even assuming that existing systems could be modified to apply a thin coating to points on an optical element where adhesive would be applied, the present invention offers additional advantages. Existing systems used to apply thin coatings to polished optical surfaces are designed to apply a coating with a very precise thickness. Such precision is not necessary when applying a coating to an optical element to prevent light from impinging upon adhesive holding an optical element in place. Thus, using modified current coating systems would be more expensive and time consuming than the use of the current invention because of the system setup time needed and the additional complexities associated with working with systems designed to be very precise.

Further embodiments, features, and advantages of the present invention, as well as the structure and operation of the various embodiments of the present invention are described in detail below with reference to accompanying drawings.

BRIEF DESCRIPTION OF THE FIGURES

The present invention is described with reference to the accompanying drawings. In the drawings, like reference numbers indicate identical or functionally similar elements. The drawing in which an element first appears is indicated by the left-most digit in the corresponding reference number.

DETAILED DESCRIPTION OF THE INVENTION

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the present invention would be of significant utility.

Figure 1A:
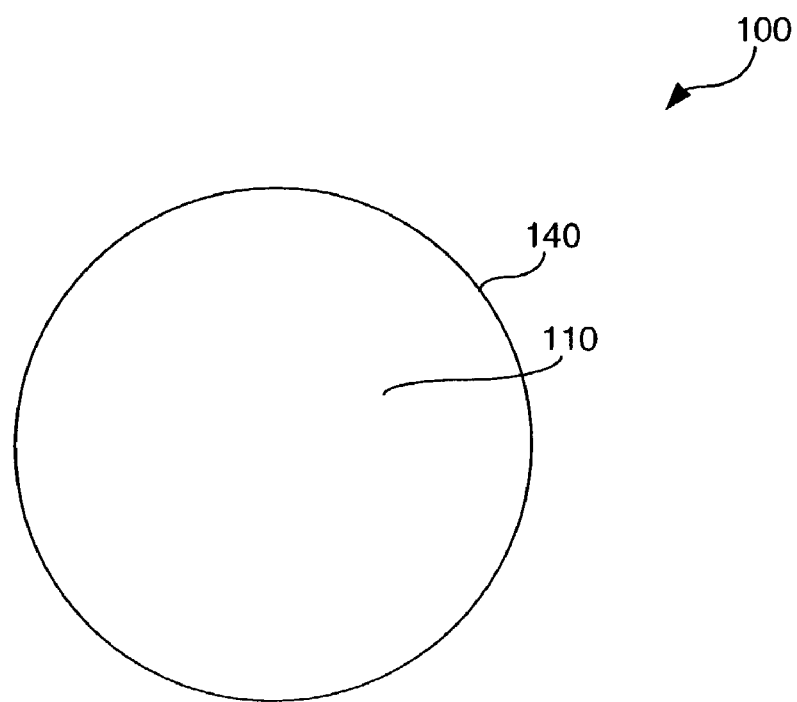
FIG. 1A is a diagram of a convex lens optical element.

FIG. 1A illustrates optical element 100. Optical element 100 may be any type of optical element that permits light to pass through. As can be more readily seen in FIG. 1B, for the ease of illustration, optical element 100 has been selected to be a convex lens.

Figure 1B:
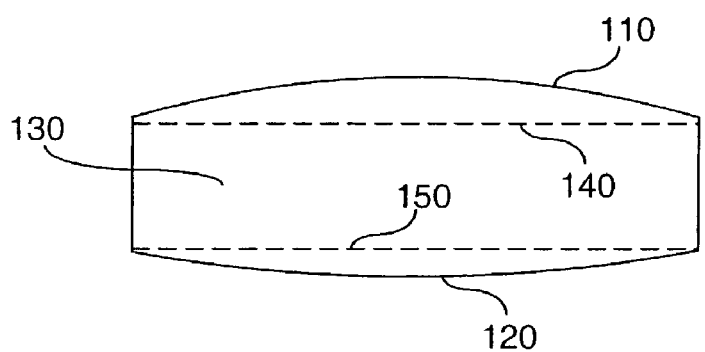
FIG. 1B is a diagram of the side view of the convex lens optical element illustrated in FIG. 1A.

FIG. 1B illustrates a perspective view of optical element 100. Optical element 100 comprises front polished optical surface 110, rear polished optical surface 120, edge 130, front edge boundary 140 and rear edge boundary 150.

Front edge boundary 140 represents the points formed where edge 130 meets front polished optical surface 110. Rear edge boundary 150 represents the points where edge 130 meets rear polished optical surface 120. When in use, a light source will produce light that is intended to travel through optical element 100 entering through front polished optical surface 110 and exiting through rear polished optical surface 120. Additionally, a portion of the transmitted light will be internally scattered within optical element 100 and emitted through edge 130.

Figure 2:
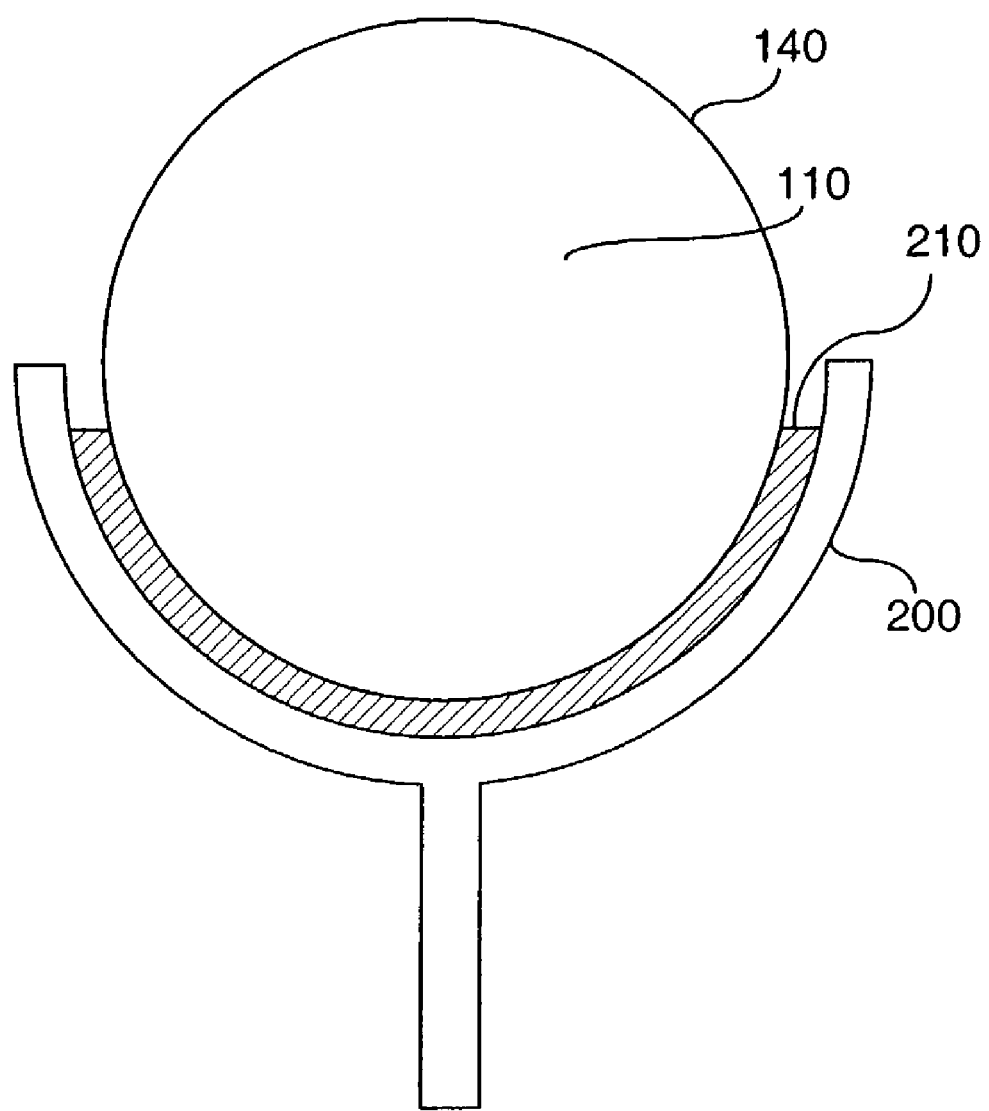
FIG. 2 is a diagram of a convex lens optical element held in place in a mount with an adhesive.

FIG. 2 illustrates optical element 100 positioned in mount 200 and held in place by adhesive 210, without a light absorbing coating applied to its edge. This represents the current method for securing an optical element in place with adhesive on its edge. Similarly, spots of adhesive may be applied to a polished surface of an optical element to secure the optical element. For ease of illustration, only the situation where an adhesive is applied to an edge is depicted. Those skilled in the relevant art(s) will be able to readily apply the techniques illustrated by the figures to the situation where adhesive is used on a polished surface. In the depicted configuration, adhesive 210 creates a bond, or multiple bonds if individual adhesive spots are used, between edge 130 and mount 200 that keeps optical element 100 in place and prevents movement. Examples of adhesives that may be used include, but are not limited to, DYMAX 602 with or without 501 or 535 accelerant (available from Dymax Corporation, Torrington, Conn.), SCOTCHWELD 2216 epoxy (available from 3M, St. Paul, Minn.) and NORLAND 61 (available from Norland Products; Cranberry, N.J.). A portion of the light passing through the polished optical surfaces of optical element 100 will be internally scattered, emitted through edge 130, and will impinge upon adhesive 210. Over time ultra-violet light impinges upon adhesive 210, leading to adhesive 210 breaking down and diminishing its holding strength. As a result, optical element 100 may shift or even become dislodged, distorting the transmission of light and impairing the operation of the optical system containing optical element 100.

Figure 3:
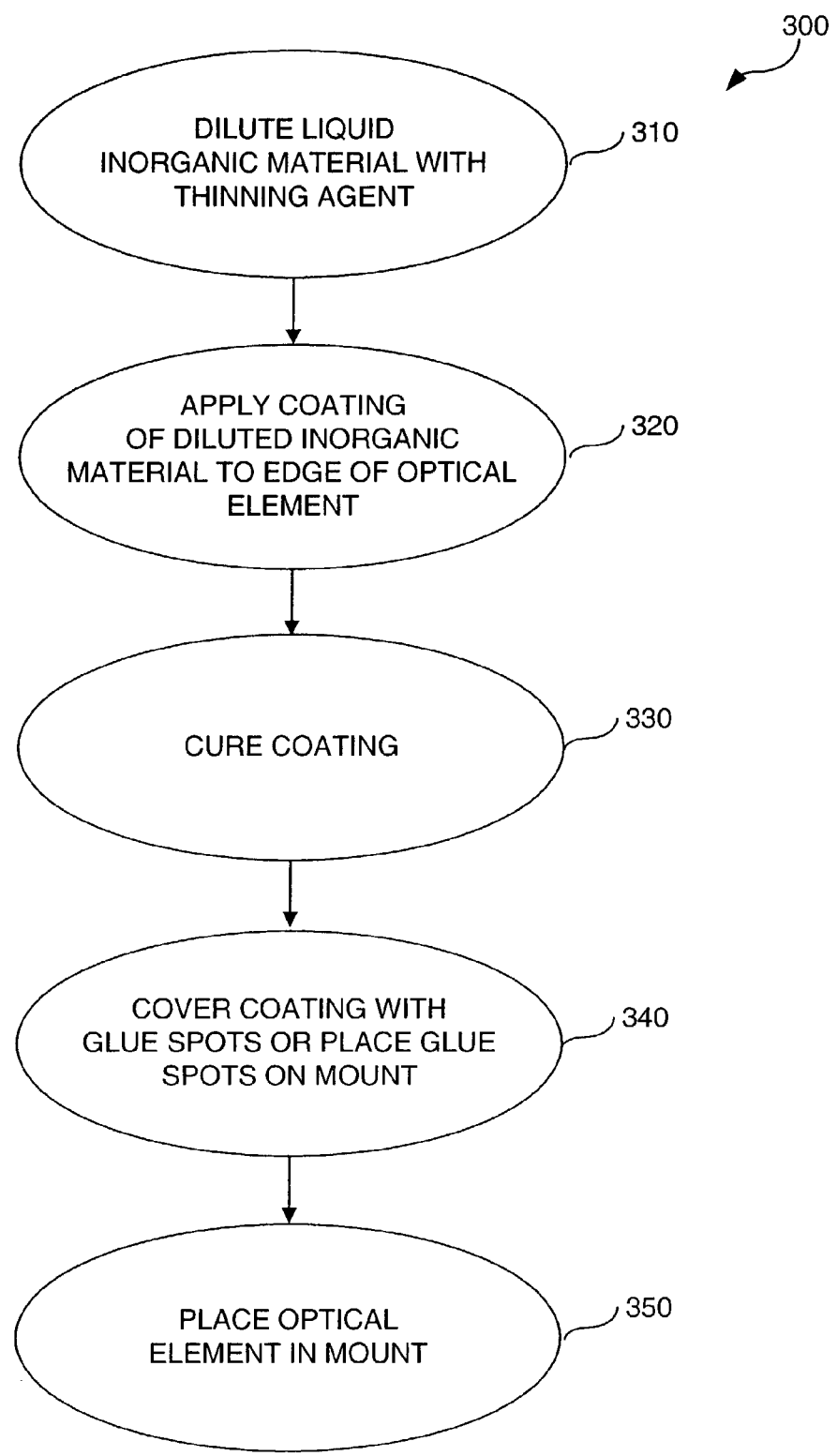
FIG. 3 is a flowchart diagram that shows a method for reducing light emitted through an edge of an optical element, according to an embodiment of the present invention.

The process illustrated in FIG. 3 presents a method 300 for reducing light emitted through edge 130, whereby an optically inert, light absorbing coating protects adhesive 210 used to hold optical element 100 in place from light induced deterioration. The process begins with a step 310. In a step 310, a liquid organoxy-metallic compound is diluted with a thinning agent. Example thinning agents include, but are not limited to 1-butonol, 99.8%, anhydrous; ethyl acetate, 99.8%, HPLC grade; and dichloromethane, 99.8%, anhydrous. These thinning agents are commonly used and available from multiple suppliers with identical specifications. Other thinning agents will be known to persons skilled in the relevant art(s) from the teachings herein.

In one embodiment of the invention, the organoxy-metallic compound is titanium (IV) butoxide polymer, which is generally available from Aldrich Chemical Company, Milwaukee, Wis. Examples of other organoxy-metallic compounds that may be used include, but are not limited to, the families of silicones and titanium (IV) alkoxides which are converted to the metal oxides-silicone dioxide and titanium dioxide. Other organoxy-metallic compounds that can be used in connection with the present invention will become apparent to persons skilled in the relevant art(s) from the teachings herein.

A preferred ratio of thinning agent to organoxy-metallic compound is about one to one. Alternative ratios may be used ranging from a ratio of about one part thinning agent to three parts liquid inorganic material, to a ratio of about three parts thinning agent to one part liquid inorganic material. Alternatively, no thinning agent may be used.

In a step 320, the diluted organoxy-metallic compound is applied to edge 130 creating a coating. The coating covers edge 130 between front edge boundary 140 and rear edge boundary 150. The coating may range in thickness from about one nanometer to two hundred micrometers. The primary consideration when applying the coating is that the thickness should not be so thick as to impair the proper positioning of the optical element in the mount.

In one embodiment, the diluted organoxy-metallic compound is manually applied using an optical applicator cloth. In another embodiment, a modified spin coating technique may be used to apply the coating to an edge. Traditional spin coating techniques consist of depositing a coating fluid on a semiconductor wafer or other surface to be coated. The wafer is spun around its central axis to distribute the coating over its surface. A similar approach may be applied here. In this case, the optical element is also spun about its central axis. However, rather than depositing the organoxy-metallic compound on the surface of the optical element, the material is deposited on the edge of the optical element by holding an applicator soaked with the diluted organoxy-metallic compound against the edge as it spins. Other applicators, such as a brush, sponge, blade or the like may be used in either approach and will be known to persons skilled in the relevant art(s) from the teachings herein.

In a step 330, the coating is exposed in ambient air to ultra-violet light and cured to form the light absorbing coating. Broad band ultra-violet light from a Hg or Xe source mayn be used. Alternatively, monochromatic ultra-violet light from an excimer laser may also be used and be effective in curing the coating. For example, the inventors used three DYMAX 50 WATT (bulb #35003) fiberoptic ultra-violet curing lamps to cure a titanium dioxide coated area. The fibers on the lamps were about one inch from the sample, and the exposure time for the sample was about 20 minutes. If a diluting agent is used, the organoxy-metallic compound should set for a sufficient period of time to allow the diluting agent to evaporate.

The coating must be optically opaque to the ultra-violet wavelengths that damage the adhesive bond (e.g. 157 nm, 193 nm, and 248 nm), but should transmit with reasonable efficiency the ultra-violet wavelengths (e.g. wavelengths greater than 350 nm) used to cure the adhesives used to create the bond. In addition, the coating must be mechanically robust and must withstand routine handling of the optical element. Finally, the coating must adhere to both the optical element and the adhesive bond with sufficient strength that the secure positioning of the optical element is not compromised. Metal oxide films with the appropriate characteristics of optical absorption, optical transmission, mechanical robustness, ability to adhere to optical materials, and the ability to bond to appropriate adhesives include, but are not limited to $SiO_2$, $Al_2O_3$, $ZrO_2$, $HfO_2$, $Ta_2O_5$, $Nb_2O_5$, and $TiO_2$.

In a step 340, the light absorbing coating is covered with adhesive 210 or adhesive 210 is placed on mount 200. In a step 350, optical element 100 is placed in mount 200, and held until a bond forms between adhesive 210 and the light absorbing coating.

Additional steps or enhancements to the above steps known to persons skilled in the relevant art(s) from the teachings herein are also encompassed by the present invention.

Figure 4:
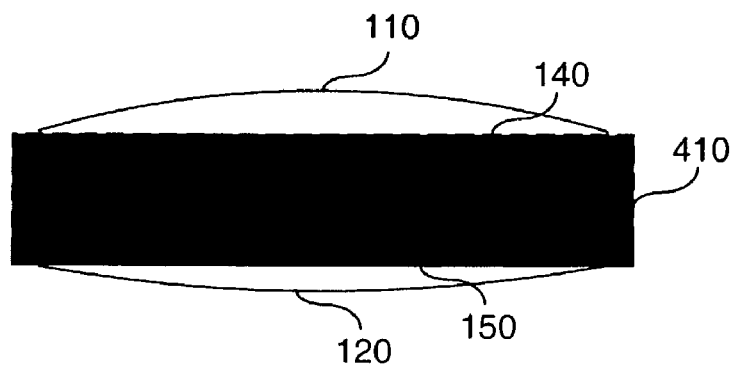
FIG. 4 is a diagram of a convex lens optical element with a light absorbing coating on its edge, according to an embodiment of the present invention.

FIG. 4 illustrates a side view of optical element 100, according to an embodiment of the present invention. In FIG. 4, light absorbing coating 410 has been applied to edge 130 through the implementation of steps 310 through steps 330. Preferably, light absorbing coating 410 should only be placed where adhesive will be applied.

Figure 5:
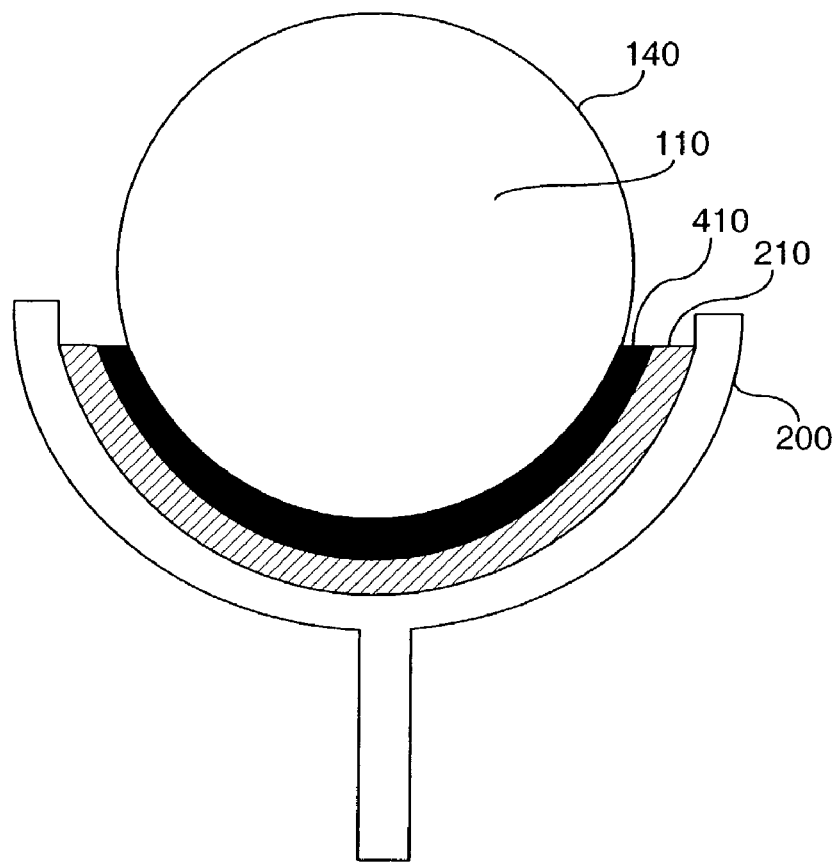
FIG. 5 is a diagram of a convex lens optical element with a light absorbing coating on its edge held in place in a mount with an adhesive, according to an embodiment of the present invention.

FIG. 5 illustrates optical element 100 with light absorbing coating 410 positioned in mount 200, according to an embodiment of the present invention. In FIG. 5, optical element 100 with light absorbing coating 410 is held in place in mount 200 according to steps 340 and 350. In this configuration, the amount of light that impinges upon adhesive 210 will be reduced by the existence of light absorbing coating 410 between edge 130 of optical element 100 and adhesive 210.

An exemplary embodiment of an optical element having a coated edge made according to the method described in FIG. 3 has been presented. The present invention is not limited to this example. This example is presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the present invention.

CONCLUSION

While various embodiments of the present invention have been described above, it should be understood that they have been presented by way of example, and not limitation. It will be apparent to persons skilled in the relevant art that various changes in form and detail can be made therein without departing from the spirit and scope of the invention.

What is claimed is:

1. A method for protecting an adhesive, which is used to secure an optical element, from light emitted through an edge of the optical element, comprising:
   coating an organoxy metallic compound to the edge of the optical element;
   exposing the organoxy metallic compound to ultra-violet light to convert the organoxy metallic compound to a corresponding metal oxide;
   applying the adhesive to the corresponding metal oxide; and
   securing the optical element by using the adhesive covering the corresponding metal oxide to secure the optical element to an optical mount within a photolithographic optical system, whereby the coating protects the adhesive used to hold the optical element in place from light induced deterioration.

2. The method of claim 1, wherein the organoxy metallic compound is an organo-titanium compound.

3. The method of claim 1, wherein said coating step comprises coating the edge of the optical element using an optical applicator cloth or spin-coating the organoxy metallic compound onto the edges of the optical element.

4. The method of claim 1, wherein a thickness of the coating ranges from about one nanometer to not more than about two hundred micrometers.

* * * * *

UNITED STATES PATENT AND TRADEMARK OFFICE
CERTIFICATE OF CORRECTION

PATENT NO. : 7,081,278 B2 Page 1 of 1
APPLICATION NO. : 10/253655
DATED : July 25, 2006
INVENTOR(S) : Lipson et al.

It is certified that error appears in the above-identified patent and that said Letters Patent is hereby corrected as shown below:

In the Foreign Patent Documents section "DE 1 011 589 7/1959" should be
-- DE 1 011 589 7/1957--.

Signed and Sealed this

Thirtieth Day of January, 2007

JON W. DUDAS
*Director of the United States Patent and Trademark Office*